United States Patent [19]

Sunouchi

[11] Patent Number: 5,373,542
[45] Date of Patent: Dec. 13, 1994

[54] COUNTER CIRCUIT CAPABLE OF GENERATING ADJUSTABLE PRECISE DESIRED FREQUENCY

[75] Inventor: Shigemi Sunouchi, Yamagata, Japan

[73] Assignee: NEC Corporation, Tokyo, Japan

[21] Appl. No.: 982,624

[22] Filed: Nov. 27, 1992

[30] Foreign Application Priority Data

Nov. 27, 1991 [JP] Japan .................. 3-311205

[51] Int. Cl.⁵ .............................. G04F 10/04
[52] U.S. Cl. ........................ 377/44; 377/46; 377/52
[58] Field of Search ......... 377/39, 44, 46, 47, 377/52, 56, 110, 114, 122, 124, 126, 48

[56] References Cited

U.S. PATENT DOCUMENTS

| | | | |
|---|---|---|---|
| 3,594,551 | 7/1971 | Shearer | 377/39 |
| 3,609,311 | 9/1971 | Wayne | 377/46 |
| 3,824,379 | 7/1974 | Tomisawa et al. | 377/46 |
| 4,545,063 | 10/1985 | Kamimaru | 377/44 |
| 4,866,740 | 9/1989 | Iijima | 377/39 |
| 4,958,362 | 9/1990 | Nishibe et al. | 377/44 |
| 4,962,483 | 10/1990 | Lodhi | 377/70 |
| 4,989,224 | 1/1991 | Narahara et al. | 377/56 |
| 5,065,415 | 11/1991 | Yamashita | 377/52 |
| 5,086,441 | 2/1992 | Maemura et al. | 377/114 |

*Primary Examiner*—Timothy P. Callahan
*Assistant Examiner*—T. T. Lam
*Attorney, Agent, or Firm*—Sughrue, Mion, Zinn, Macpeak & Seas

[57] ABSTRACT

A programmable counter composed of D-type flipflops receives a clock pulse having a constant frequency and is configured to generate a count pulse when a count value reaches a programmed number. A ring counter composed of D-type flipflops receives the count pulse from the programmable counter. A coincidence detection and control circuit detects a predetermined count value of the ring counter, and modifies the programmed maximum count number of the programmable counter, so that the maximum count value of the programmable counter can be selected from either an ordinary maximum count number or the predetermined maximum count number.

6 Claims, 2 Drawing Sheets

COUNTER CIRCUIT CAPABLE OF GENERATING ADJUSTABLE PRECISE DESIRED FREQUENCY

BACKGROUND OF THE INVENTION

1. Field of the Invention

The present invention relates to a counter circuit, and more specifically to a counter circuit having a ring counter and capable of freely and precisely adjusting a counted-down frequency generated by the ring counter.

2. Description of Related Art

One typical conventional counter circuit is composed of a ring counter and a programmable counter. In order to generate a desired frequency from a frequency of a given clock pulse (CP, count pulse), the program counter is programmed with a value obtained by dividing the frequency of the clock pulse by the desired frequency, and also by dividing an obtained quotient by a maximum count number of the ring counter, and deriving an integer component from a finally obtained quotient. For example assume that the clock pulse is of the frequency of 200 KHz and the desired frequency is 780 Hz, and also assume that the ring counter is composed of six stages so as to have the maximum counter number of "12". In this case, COUNT NUMBER=(200 KHz÷780 Hz)÷12≈21.36

Therefore, if the counter number of "21" is set to the program counter,

DESIRED FREQUENCY=1÷{(1/200 KHz)×21×12}≈794 Hz

Namely, an error is 1.8%

On the other hand, if the counter number of "22" is set to the program counter,

DESIRED FREQUENCY=1÷{(1/200 KHz)×22×12}≈758 Hz

Namely, an error is 2.8%

In this case, accordingly, the program counter is set with the counter number "21", so that the counter circuit is realized with the error of 1.8%.

As will be apparent from the above, the conventional counter circuit has been disadvantageous in that, since the ring counter constituting a polynomial counter has a fixed stage number (namely, bit number), when the frequency of the clock pulse (CP) is constant, an error from a desired frequency often becomes large.

SUMMARY OF THE INVENTION

Accordingly, it is an object of the present invention to provide a counter circuit which has overcome the above mentioned defect of the conventional one.

Another object of the present invention is to provide a counter circuit having a ring counter and a programmable counter and capable of freely and precisely generating any desired frequency.

The above and other objects of the present invention are achieved in accordance with the present invention by a counter circuit comprising a programmable counter receiving a clock pulse of a constant frequency and so configured that a count number can be adjusted with a programmed number, a ring counter connected to receive as a count pulse an output of the programmable counter, and a coincidence detection and control circuit configured to monitor a court value of the ring counter and to supply a first programmed number to the programmable counter when the count value of the ring counter is not coincident with a preset value, the coincidence detection and control circuit supplying a second programmed number to the programmable counter when the count value of the ring counter becomes coincident with the preset value.

The above and other objects, features and advantages of the present invention will be apparent from the following description of preferred embodiments of the invention with reference to the accompanying drawings.

DESCRIPTION OF THE PREFERRED EMBODIMENTS

Figure 1:
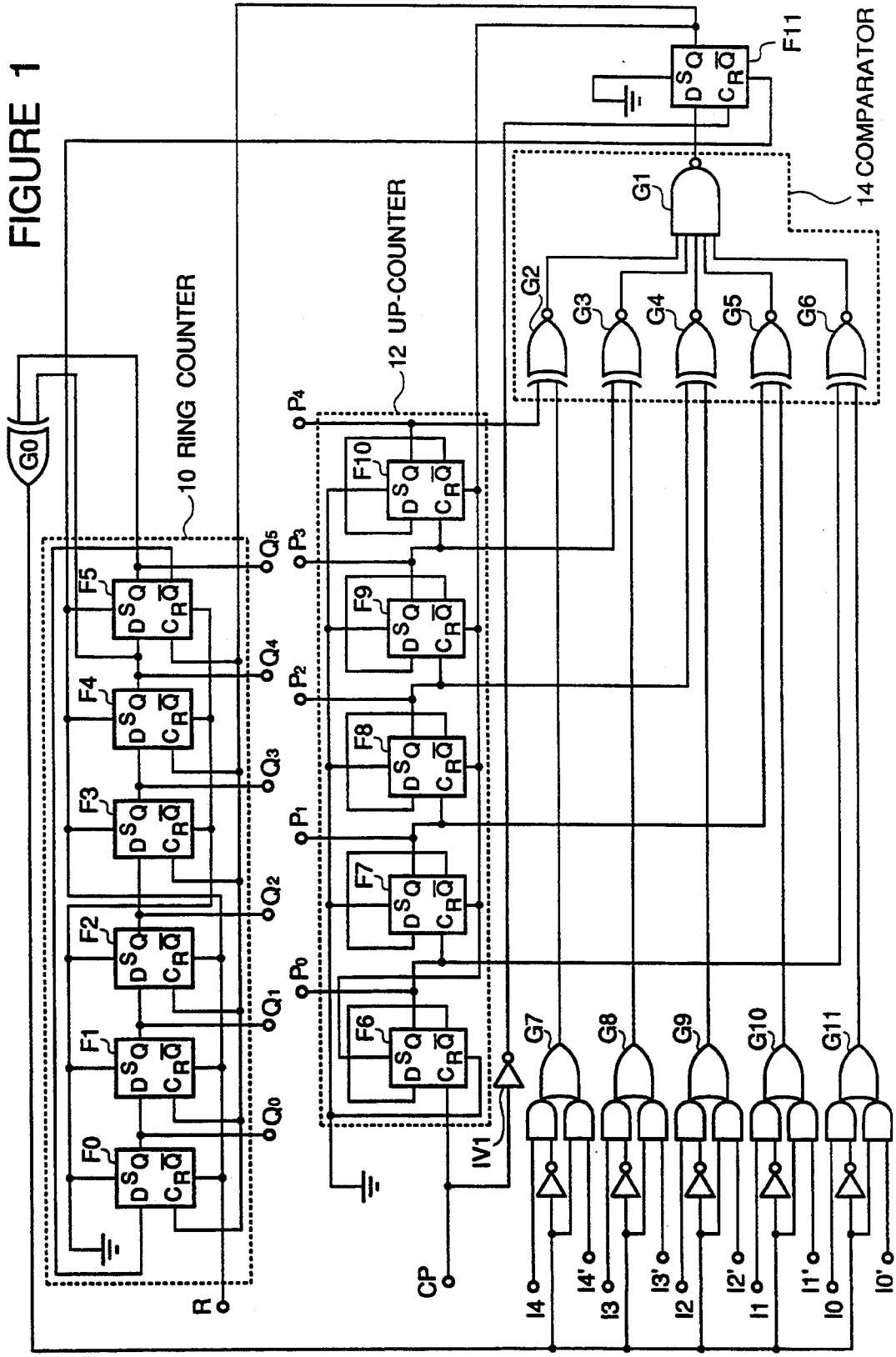
FIG. 1 is a diagrammatic logic circuit of an embodiment of the counter circuit in accordance with the present invention.

Referring to FIG. 1, there is shown a diagrammatic logic circuit of an embodiment of the counter circuit in accordance with the present invention.

The shown counter circuit includes a 6-bit ring counter 10 composed of D-type flipflops F0 to F5 connected as shown so as to be able to have a maximum count number of "12". The non-inverted outputs Q of the flipflops F0 to F4 are connected to a data input D of the flipflops F1 to F5, respectively, and the inverted outputs $\overline{Q}$ of the flipflop F5 is connected to a data input D of the flipflop F0. The non-inverted outputs Q of the flipflops F0 to F5 also are connected to output terminals $Q_0$ to $Q_5$, respectively. A reset input R of the flipflops F0 to F2 and a set input S of the flipflops F3 to F5 are connected in common to a reset terminal R, and a set input S of the flipflops F0 to F2 and a reset input R of the flipflops F3 to F5 are connected in common to ground. The clock inputs C of the flipflops F0 to F5 are respectively connected in common to receive a count pulse from a programmable 5-bit up-counter, which in turn includes a 5-bit up-counter 12 composed of D-type flipflops F6 to F10 connected as shown so as to be able to have a maximum count number of "31". An arbitrary value not greater than "31" can be programmed with inputs I0 to I4.

A clock input C of the flipflop F6 is connected to a clock pulse terminal CP, and the non-inverted outputs Q of the flipflops F6 to F9 are connected to a clock input C of the flipflops F7 to F10, respectively. A data input D of each of the flipflops F6 to F10 is connected to an inverted output $\overline{Q}$ of each flipflop itself. A reset input R of the flipflop F6 and a set input S of the flipflops F7 to F10 are grounded, and a set input S of the flipflop F6 and a reset input R of the flipflops F7 to F10 are connected in common to receive the same count pulse as that applied to the ring counter. In addition, the non-inverted output Q of the flipflops F6 to F10 are connected to output terminals $P_0$ to $P_4$, respectively, and also connected to one input of exclusive NOR gates G2 to G6, respectively.

An output of each of the exclusive NOR gates G2 to G6 is connected to a NAND gate G1, which has an output connected to a data input D of another D-type flipflop F11. A reset input R of the flipflop F11 is connected to the reset terminal R together with the reset input R of the flipflops F0 to F2 and the set input S of the flipflops F3 to F5. A set input S of the flipflop F11 is grounded and a clock input C of the flipflop F11 is connected to an output of an inverter IV1 having an input connected to the clock pulse input terminal CP. A non-inverted output Q of the flipflop F11 outputs the above mentioned count pulse.

With the above arrangement, the NAND gate G1 and the exclusive-NOR gates G2 to G6 cooperate to constitute a 5-bit comparator 14, which acts to detect whether or not the count number of the 5-bit counter of F6 to F10 becomes coincident with a programmed number supplied through the inputs I4 to I0 or I4' to I0'. The flipflop F11 acts to hold the result of comparison outputted from the 5-bit comparator, for a period of time of one clock pulse, for the purpose of resetting the 5-bit up counter 10. The programmable 5-bit up-counter is constituted of the up counter 10, the comparator 14 and the flipflop F11.

Furthermore, there is provided an exclusive-OR gate G0 for producing a clock signal of a predetermined frequency from the ring counter. In the shown embodiment, the gate G0 functions to detect two codes (000001 and 111110) from the 12 codes of the ring counter. Here, the "code" means a set of logical values of respective non-inverted outputs Q of the flipflops F0 to F5. The purpose of provision of the gate G0 is to change the programmed number of the programmable 5-bit up-counter by use of the two codes selected from the 12 codes of the 6-bit ring counter, in order to cause the generated frequency to approach a desired frequency. As shown in FIG. 1, the two inputs of the gate G0 are respectively connected to the non-inverted outputs Q of the flipflops F4 and F5 of the ring counter.

An output of the gate G0 is connected to a selection input of each of selector gates G7 to G11, each of which is composed of a pair of AND gates, an OR gate receiving an output of each of the AND gates, and an inverter connected to one input of one of the AND gates, as shown in FIG. 1. The selector gates G7 to G11 receive at their one input a first group of setting inputs I4 to I0 and at their other input a second group of setting inputs I4' to I0' respectively. An output of the selector gates G7 to G11 are connected to the other input of the gates G2 to G6, respectively. Thus, when the output of the gate G0 is of "0", the selector gates G7 to G11 select the first group of setting inputs I4 to I0, and when the output of the gate G0 is of "1", the selector gates G7 to G11 select the second group of setting inputs I4' I0'.

Figure 2:
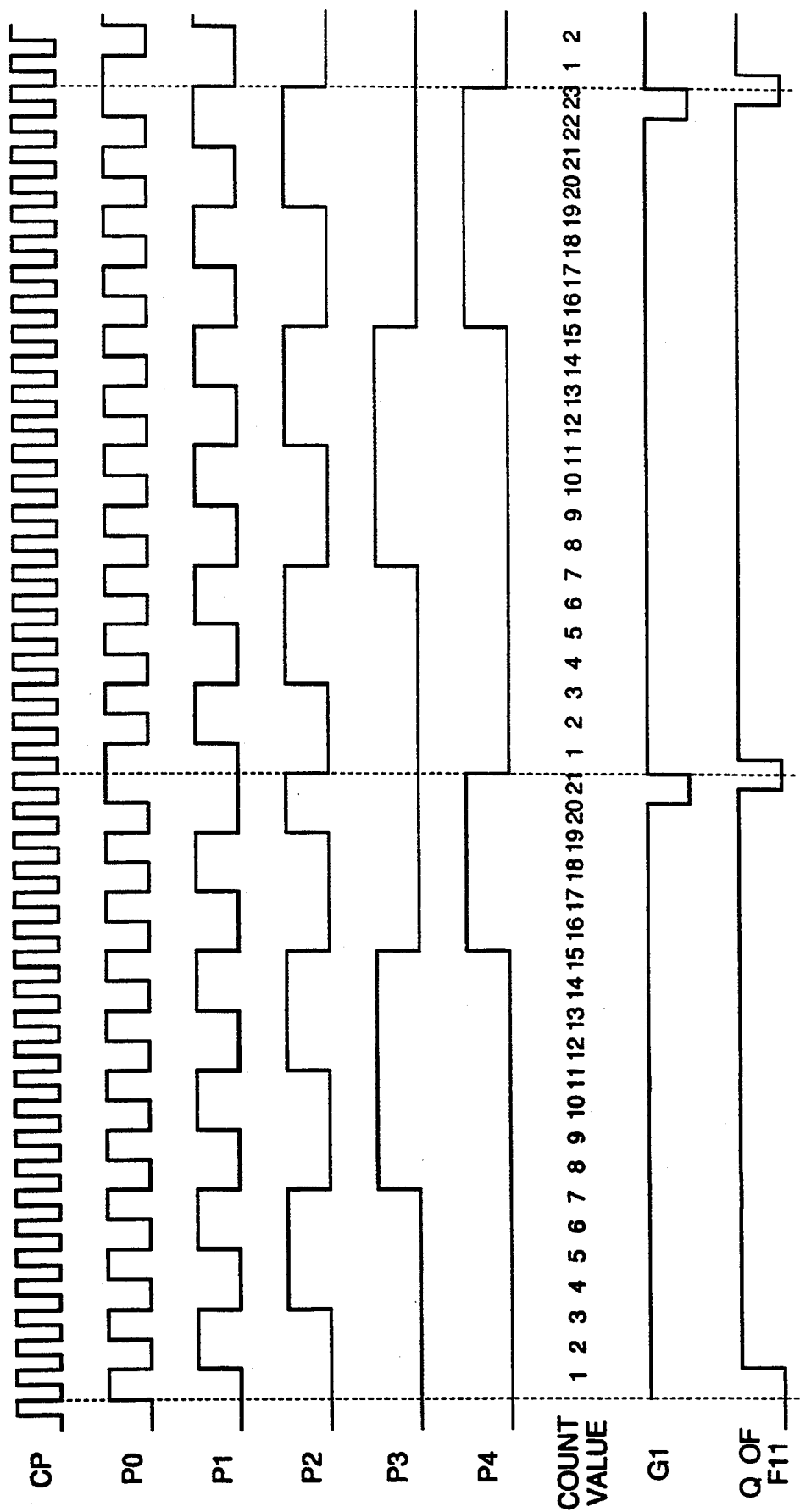
FIG. 2 is a timing chart illustrating an operation of the counter circuit shown in FIG. 1.

Now, operation of the counter shown in FIG. 1 will be described with reference to the timing chart of FIG. 2, assuming that a constant clock pulse (CP) is 200C KHz and a desired frequency is 780 Hz.

(1) Normal Operation

COUNT NUMBER $T_1 = (200 \text{ KHz} \div 780 \text{ Hz}) \div 12 \approx 21.36$ therefore, $T_1 = 21$.

(2) Correction Time

COUNT NUMBER $T_2 = \{(200 \text{ KHz} \div 780 \text{ Hz}) - T_1 \times 10\} \div 2 \approx 23.20$ therefore, $T_2 = 23$.

Namely, if the programmable counter counts the count value of "21" in a normal operation ($T_1$) but counts the count value of "23" at a correction time ($T_2$), the desired frequency can be expressed as follows:

DESIRED FREQUENCY =

$1 \div \{(1 \div 200 \text{ KHz}) \times 21 \times 10 +$ $(1 \div 200 \text{ KHz}) \times 23 \times 2\} \approx 781.$ Namely, the error becomes 0.13%.

As will be apparent from the above, for a normal counting operation, the first group of setting inputs I0 to I4 are set with "10101" corresponding to the count number "21", and for a correction time, the second group of setting inputs I'0 to I'4 are set with "10111" corresponding to the count number "23". Thus, in the normal counting operation, the programmable counter operates as the up-counter of the count number "21" as shown in a left half of FIG. 2, and at the correction time, namely when the count value of the ring counter becomes two values expressed by the codes "000001" and "111110", the programmable counter operates as the up-counter of the count number "23" as shown in a right half of FIG. 2.

Therefore, the exclusive OR gate G0 operates to detect whether or not the count value of the ring counter 10 becomes coincident with a preset value or preset values, and the selector gates G7 to G11 select or control, on the basis of the coincidence detection of the gate G0, the programmed number to be supplied to the programmable counter. Namely, the exclusive-OR gate G0 and the selector gates G7 to G11 cooperates to constitute a coincidence detection and control circuit. On the other hand, the number of the count number to be detected by the coincidence detection circuit is not limited to two, and also, the number of the programmed count numbers is not limited to two. Therefore, the coincidence detection circuit can be formed of not only the exclusive-OR gate, but also any other logic gate or circuit having one, or two, or three or more inputs connected to different flapflops of the ring counter.

As seen from the above, the counter circuit in accordance with the present invention is so configured that when the count value of the ring counter becomes a predetermined value, it is detected by the coincidence circuit, and the count number of the programmable counter is changed to another number so as to correct the frequency generated by the counter circuit. Thus, the counter circuit in accordance with the present invention can generates a frequency close to the desired frequency.

The invention has thus been shown and described with reference to the specific embodiments. However, it should be noted that the present invention is in no way limited to the details of the illustrated structures but changes and modifications may be made within the scope of the appended claims.

I claim:

1. A counter circuit comprising a programmable counter receiving a clock pulse of a constant frequency and having a count number that can be adjusted with a supplied programmed number, a ring counter connected to receive as a count pulse an output of the programmable counter, and a coincidence detection and control circuit, coupled between said ring counter and said programmable counter, for monitoring a count value of said ring counter and for supplying a first programmed number to said programmable counter when said count value of said ring counter is not coincident with a present value, said coincidence detection and control circuit supplying a second programmed number to said programmable counter when said count value of said ring counter becomes coincident with said present value.

2. A counter circuit claimed in claim 1 further including a first group of setting inputs receiving said first programmed number and a second group of setting inputs receiving said second programmed number, and wherein said coincidence detector and control circuit includes a coincidence detection circuit connected to said ring counter for detecting that the count value of said ring counter becomes said preset value, and a selector gate circuit connected to said first group of setting inputs and said second group of setting inputs, said selector gate circuit being controlled by said coincidence detection circuit so as to supply said first programmed number to said programmable counter when said count value of said ring counter is not coincident with said preset value, and to supply said second programmed number to said programmable counter when said count value of said ring counter becomes coincident with said preset value.

3. A counter circuit claimed in claim 2 wherein said ring counter is composed of a number of D-type flipflops connected in cascade, and said coincidence detection circuit includes an exclusive-OR gate having two inputs connected to an output of two different flipflops of said number of D-type flipflops.

4. A counter circuit claimed in claim 3 wherein said selector gate circuit includes a plurality of unitary selector circuits each composed of at least two AND gates and an OR gate.

5. A counter circuit claimed in claim 3 wherein said programmable counter includes an up-counter composed of a plurality of flipflops, and a comparator circuit for comparing an output of said up-counter with an output of said selector gate circuit.

6. A counter circuit claimed in claim 5 wherein said comparator circuit includes a plurality of NAND gates each receiving at its one input one bit of said output of said up-counter and at its other input a corresponding bit of said output of said selector gate circuit, and an NAND gate receiving outputs of all said NAND gates.

* * * * *

UNITED STATES PATENT AND TRADEMARK OFFICE
CERTIFICATE OF CORRECTION

PATENT NO. : 5,373,542

DATED : December 13, 1994

INVENTOR(S) : Shigemi Sunouchi

It is certified that error appears in the above-identified patent and that said Letters Patent is hereby corrected as shown below:

Column 1, line 35, delete "1.8%", and insert --2.8%--;

Column 4, line 42, delete "flapflops", and insert --flipflops--.

Signed and Sealed this

Second Day of April, 1996

Attest:

BRUCE LEHMAN

Attesting Officer

Commissioner of Patents and Trademarks